(12) United States Patent
Adusumilli et al.

(10) Patent No.: US 10,396,165 B2
(45) Date of Patent: Aug. 27, 2019

(54) THIN LOW DEFECT RELAXED SILICON GERMANIUM LAYERS ON BULK SILICON SUBSTRATES

(71) Applicant: International Business Machines Corporation, Armonk, NY (US)

(72) Inventors: Praneet Adusumilli, Albany, NY (US); Keith E. Fogel, Hopewell Junction, NY (US); Alexander Reznicek, Troy, NY (US); Oscar van der Straten, Guilderland Center, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/902,515

(22) Filed: Feb. 22, 2018

(65) Prior Publication Data

US 2018/0182720 A1    Jun. 28, 2018

Related U.S. Application Data

(62) Division of application No. 15/271,939, filed on Sep. 21, 2016, now Pat. No. 9,922,941.

(51) Int. Cl.
*H01L 23/00*    (2006.01)
*H01L 29/32*    (2006.01)
(Continued)

(52) U.S. Cl.
CPC .......... *H01L 29/32* (2013.01); *H01L 21/0245* (2013.01); *H01L 21/0251* (2013.01);
(Continued)

(58) Field of Classification Search
CPC ................ H01L 29/165; H01L 21/02532
See application file for complete search history.

(56) References Cited

U.S. PATENT DOCUMENTS 5,659,187 A    8/1997  Legoues et al.
6,313,016 B1   11/2001  Kibbel et al.
(Continued)

FOREIGN PATENT DOCUMENTS

KR    1020050060982 A    6/2005

OTHER PUBLICATIONS

List of IBM Patents or Patent Applications Treated As Related dated Feb. 22, 2018, 2 pages.

*Primary Examiner* — Thao P Le
(74) *Attorney, Agent, or Firm* — Scully, Scott, Murphy & Presser, P.C.; Daniel P. Morris, Esq.

(57) ABSTRACT

A strain relaxed silicon germanium layer that has a low defect density is formed on a surface of a silicon substrate without causing wafer bowing. The strain relaxed silicon germanium layer is formed using multiple epitaxial growing, bonding and transferring steps. In the present application, a thick silicon germanium layer having a low defect density is grown on a transferred portion of a topmost silicon germanium sub-layer of an initial strain relaxed silicon germanium graded buffer layer and then bonded to a silicon substrate. A portion of the thick silicon germanium layer is then transferred to the silicon substrate. Additional steps of growing a thick silicon germanium layer having a low defect density, bonding and layer transfer may be performed as necessary.

15 Claims, 5 Drawing Sheets

(51) Int. Cl.
 *H01L 21/02* (2006.01)
 *H01L 29/161* (2006.01)
(52) U.S. Cl.
 CPC .... *H01L 21/0262* (2013.01); *H01L 21/02381* (2013.01); *H01L 21/02532* (2013.01); *H01L 21/02658* (2013.01); *H01L 21/02664* (2013.01); *H01L 29/161* (2013.01)

(56) References Cited

U.S. PATENT DOCUMENTS

| | | |
|---|---|---|
| 6,524,935 B1 | 2/2003 | Canaperi et al. |
| 6,713,326 B2 | 3/2004 | Cheng et al. |
| 6,793,731 B2 | 9/2004 | Hsu et al. |
| 6,921,914 B2 | 7/2005 | Cheng et al. |
| 7,041,170 B2 | 5/2006 | Fitzgerald et al. |
| 7,307,273 B2 | 12/2007 | Currie |
| 7,723,214 B2 | 5/2010 | Storck |
| 9,922,941 B1* | 3/2018 | Adusumilli ....... H01L 21/02381 |
| 2002/0100942 A1 | 8/2002 | Fitzgerald et al. |
| 2003/0003679 A1 | 1/2003 | Doyle et al. |
| 2004/0053477 A1 | 3/2004 | Ghyselen et al. |
| 2004/0137698 A1 | 7/2004 | Taraschi et al. |
| 2006/0258126 A1 | 11/2006 | Shiono et al. |
| 2007/0262295 A1* | 11/2007 | Enicks ................. H01L 29/167 |
| | | 257/19 |
| 2011/0230031 A1* | 9/2011 | Griglione ............. H01L 29/161 |
| | | 438/312 |
| 2017/0229545 A1* | 8/2017 | Balakrishnan ...... H01L 29/1054 |

\* cited by examiner

THIN LOW DEFECT RELAXED SILICON GERMANIUM LAYERS ON BULK SILICON SUBSTRATES

BACKGROUND

The present application relates to a semiconductor structure and a method of forming the same. More particularly, the present application relates to a semiconductor structure containing a strain relaxed silicon germanium layer that has a low defect density, and a method of forming the same.

Graded buffer layers (GBLs), also referred to as strain relaxed buffer layers, are currently one of the front up approaches for 7 nm node and beyond technologies. GBLs can enable dual channel material FinFETs on a same substrate. For example, and after the relaxed top silicon germanium layer (SiGe) of the GBL is formed, strained silicon can be formed on a first portion of the relaxed top SiGe layer and in an nFET device region, and a high germanium percentage SiGe alloy can be formed on a second portion of the relaxed top SiGe layer and in a pFET device region. The biggest challenge with the process and device yields is the defect density at the surface of the GBL.

It has been shown that the thicker the SiGe layer of the GBL is, the lower the defect density at the surface of the SiGe layer is. The reason for that is the movement and subsequent annihilation of the threading dislocations in the SiGe layer become easier as the thickness of the SiGe layer increases. As thicker SiGe layers are grown, a large bow of the silicon wafer is observed. The relaxed SiGe layer is at a larger lattice constant than the silicon substrate and as the thickness of the SiGe layer increases, the more the underlying silicon wafer gets bowed. Five micrometer to eight micrometer thick SiGe layers can be grown safely, but for slightly thicker SiGe layers (10 micrometers to 12 micrometers), there is the possibility of wafer breakage. As such, and for a SiGe layer thickness range needed to have desired low defect densities (less than 100 defect atoms/cm$^2$), wafer breakage will occur due to the large bow stress applied to the wafer. Additional acceptable bow (no wafer breakage) will create problems with semiconductor tool processing. Examples include wafer robot handling issues or non-uniformity of processes due to the bowed wafer. As such, there is a need to provide a method to form a GBL having a SiGe layer in which defect density is low and bowing issue is mitigated.

SUMMARY

A strain relaxed silicon germanium layer that has a low defect density is formed on a surface of a silicon substrate without causing wafer bowing. The strain relaxed silicon germanium layer is formed using multiple epitaxial growing, bonding and transferring steps. In the present application, a thick silicon germanium layer having a low defect density is grown on a transferred portion of a topmost silicon germanium sub-layer of an initial strain relaxed silicon germanium graded buffer layer and then bonded to a silicon substrate. A portion of the thick silicon germanium layer is then transferred to the silicon substrate. Additional steps of growing a thick silicon germanium layer having a low defect density, bonding and layer transfer may be performed as necessary.

In one aspect of the present application, a method of forming a semiconductor structure is provided. In one embodiment of the present application, the method may include forming a silicon germanium graded buffer layer having a first thickness on a surface of a first silicon substrate, wherein the silicon germanium graded buffer layer includes a plurality of silicon germanium sub-layers in which the content of germanium in each of the sub-layers increases from bottom to top. Next, a topmost silicon germanium sub-layer of the silicon germanium graded buffer layer is bonded to a second silicon substrate, and a portion of the topmost silicon germanium sub-layer is transferred to the second silicon substrate. Next, a silicon germanium layer having a second thickness that is greater than the first thickness is epitaxially grown on the transferred portion of the topmost silicon germanium sub-layer. Next, the silicon germanium layer having the second thickness is bonded to a third silicon substrate, and a portion of the silicon germanium layer having the second thickness is transferred to the third silicon substrate.

In another aspect of the present application, a semiconductor structure is provided. In one embodiment of the present application, the semiconductor structure may include a strain relaxed silicon germanium layer having a thickness from 50 nm to 1000 nm and a defect density of less than 100 defect atoms/cm$^2$ located directly on a surface of a silicon substrate. In the present application, the lattices of the strain relaxed silicon germanium layer and the silicon substrate are misaligned.

DETAILED DESCRIPTION

Figure 1:
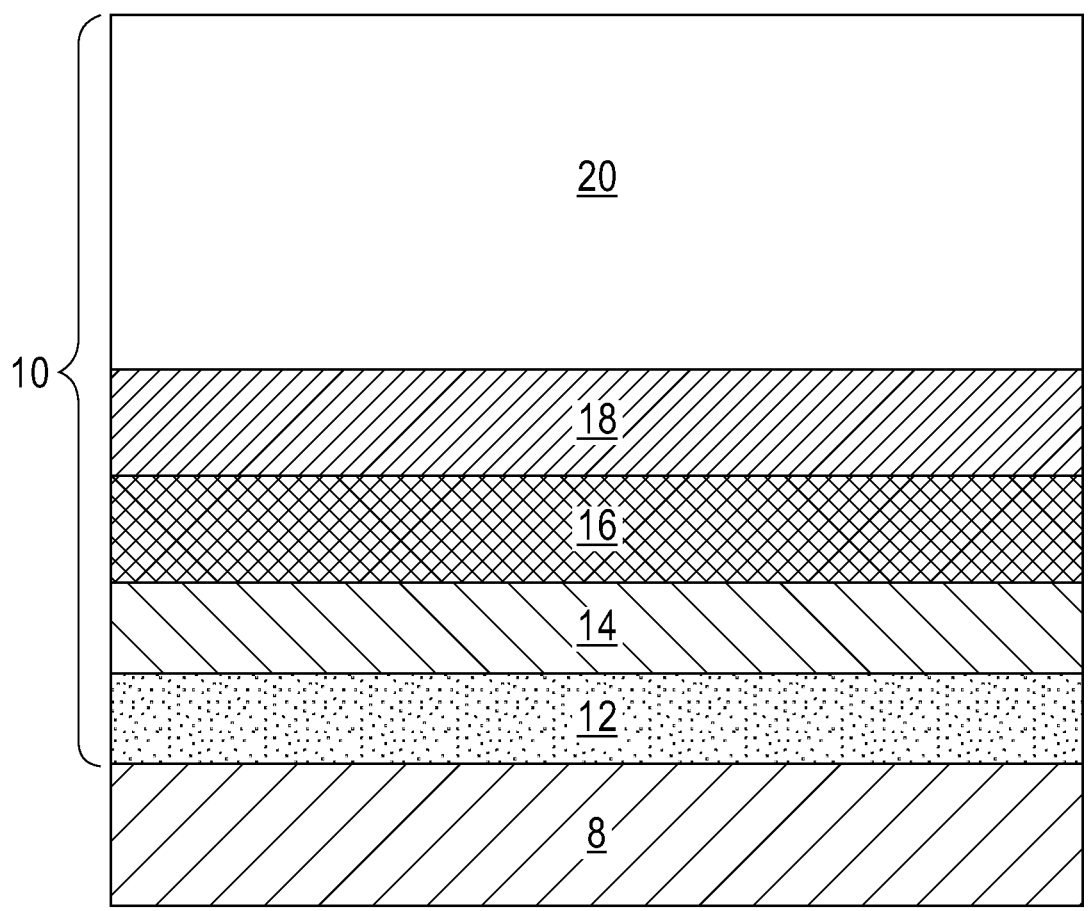
FIG. 1 is a cross sectional view of an exemplary semiconductor structure including a silicon germanium graded buffer layer having a first thickness located on a surface of a first silicon substrate, wherein the silicon germanium graded buffer layer includes a plurality of silicon germanium sub-layers in which the content of germanium in each of the sub-layers increases from bottom to top.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure that can be employed in accordance with an embodiment of the present application. The exemplary semiconductor structure shown in FIG. 1 includes a silicon germanium graded buffer layer 10 having a first thickness located on a surface of a first silicon substrate 8. The first thickness of the silicon germanium graded buffer layer 10 may be in a range from 5 micrometers to 8 micrometers. The first silicon substrate 8 is a bulk silicon substrate (i.e., the entirety of the substrate is composed of silicon). The first silicon substrate 8 is typically single crystalline.

The silicon germanium graded buffer layer 10 is strain relaxed and the silicon germanium graded buffer layer 10 includes a plurality of silicon germanium sub-layers (e.g., 12, 14, 16, 18 and 20). In one embodiment, the silicon germanium graded buffer layer 10 includes 5 sub-layers as shown in FIG. 1. The number of sub-layers of the silicon germanium graded buffer layer 10 may vary and is not limited to five sub-layers.

The silicon germanium graded buffer layer 10 is step graded. The term "step graded" denotes that the content of germanium within the silicon germanium graded buffer layer 10 increases in a non-abrupt manner upward from the interface with the silicon substrate 8. That is, the content of germanium within each silicon germanium sub-layer that provides the silicon germanium graded buffer layer increases from bottom to top.

The topmost silicon germanium sub-layer (e.g., sub-layer 20) of the silicon germanium graded buffer layer 10 has a final desired germanium content. The topmost silicon germanium sub-layer (e.g., sub-layer 20) of the silicon germanium graded buffer layer 10 also has a greater thickness than the other sub-layers (e.g., sub-layers 12, 14, 16, 18) of the silicon germanium graded buffer layer 10. In one example, the thickness of the topmost silicon germanium sub-layer (e.g., sub-layer 20) of the silicon germanium graded buffer layer 10 is from 2 micrometers to 4.5 micrometers.

In the illustrated embodiment, silicon germanium sub-layer 12, which may be referred to as a bottommost sub-layer of the silicon germanium graded buffer layer 10, has the lowest germanium content. In one embodiment, the germanium content of the bottommost sub-layer (e.g., sub-layer 12) of the silicon germanium graded buffer layer 10 can be in a range from 2 atomic percent germanium to 6 atomic percent germanium. The bottommost sub-layer (e.g., sub-layer 12) of the silicon germanium graded buffer layer 10 may have a thickness that can range from 600 nm to 1000 nm.

The silicon germanium sub-layers (e.g., sub-layers 14, 16, 18) that are located between the bottommost silicon germanium sub-layer 12 and the topmost silicon germanium sub-layer (e.g., sub-layer 20) may have a thickness in the range mentioned above for the bottommost silicon germanium sub-layer 12. The thickness of silicon germanium sub-layers (e.g., sub-layers 14, 16, 18) that are located between the bottommost silicon germanium sub-layer 12 and the topmost silicon germanium sub-layer (e.g., sub-layer 20) may be the same as, or different from, the thickness of the bottommost silicon germanium sub-layer 12.

The silicon germanium sub-layer 14 has a higher germanium content than the bottommost silicon germanium sub-layer 12. In one example, the germanium content of the silicon germanium sub-layer 14 is from 6 atomic percent germanium to 12 atomic percent germanium. The silicon germanium sub-layer 16 has a higher germanium content than the silicon germanium sub-layer 14. In one example, the germanium content of the silicon germanium sub-layer 16 is from 12 atomic percent germanium to 16 atomic percent germanium. The silicon germanium sub-layer 18 has a higher germanium content than the silicon germanium sub-layer 16. In one example, the germanium content of the silicon germanium sub-layer 18 is from 16 atomic percent germanium to 20 atomic percent germanium. The topmost silicon germanium sub-layer (e.g., sub-layer 20) has a higher germanium content than the silicon germanium sub-layer 18. In one example, the germanium content of the topmost silicon germanium sub-layer (e.g., sub-layer 20) is from 20 atomic percent germanium to 25 atomic percent germanium.

The silicon germanium graded buffer layer 10 may have a topmost layer (surface) defect density of from $5 \times 10^4$ defect atoms/cm$^2$ to $1 \times 10^7$ defect atoms/cm$^2$. The silicon germanium graded buffer layer 10 may contain threading dislocation defects that extend upward from the bottommost silicon germanium sub-layer (e.g., sub-layer 12) to the topmost silicon germanium sub-layer (e.g., sub-layer 20).

The silicon germanium graded buffer layer 10 is formed on a surface of the first silicon substrate 8 utilizing an epitaxial growth (or deposition) process. The terms "epitaxial growth and/or deposition" and "epitaxially formed and/or grown" mean the growth of a material on a deposition surface of a material, in which the material being grown has the same crystalline characteristics as the material of the deposition surface. In an epitaxial deposition process, the chemical reactants provided by the source gases are controlled and the system parameters are set so that the depositing atoms arrive at the deposition surface of the growth surface with sufficient energy to move around on the surface and orient themselves to the crystal arrangement of the atoms of the deposition surface. Therefore, an epitaxial material has the same crystalline characteristics as the deposition surface on which it is formed. In the present application, the silicon germanium graded buffer layer 10 including each of the sub-layers (e.g., sub-layers 12, 14, 16, 18 and 20) has an epitaxial relationship, i.e., same crystalline characteristic, as the silicon substrate 8.

Examples of various epitaxial growth process apparatuses that are suitable for use in forming the silicon germanium graded buffer layer 10 include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking.

A number of different sources may be used for the deposition of each sub-layer that provides the silicon germanium graded buffer layer 10. In some embodiments, the source gas for the deposition of each silicon germanium sub-layer (e.g., sub-layers 12, 14, 16, 18, 20) of the silicon germanium graded buffer layer 10 may include an admixture of a silicon containing gas source and a germanium containing gas source. Examples of silicon containing gas sources that may be employed include silane, disilane, trisilane, tetrasilane, hexachlorodisilane, tetrachlorosilane, dichlorosilane, trichlorosilane, and combinations thereof. Examples of germanium containing gas sources that may be employed include germane, digermane, halogermane, dichlorogermane, trichlorogermane, tetrachlorogermane and combinations thereof. In some embodiments, each silicon germanium sub-layer (e.g., sub-layers 12, 14, 16, 18, 20) of the silicon germanium graded buffer layer 10 can be formed from a source gas that includes a compound containing silicon and germanium. Carrier gases like hydrogen, nitrogen, helium and argon can be used.

Figure 2:
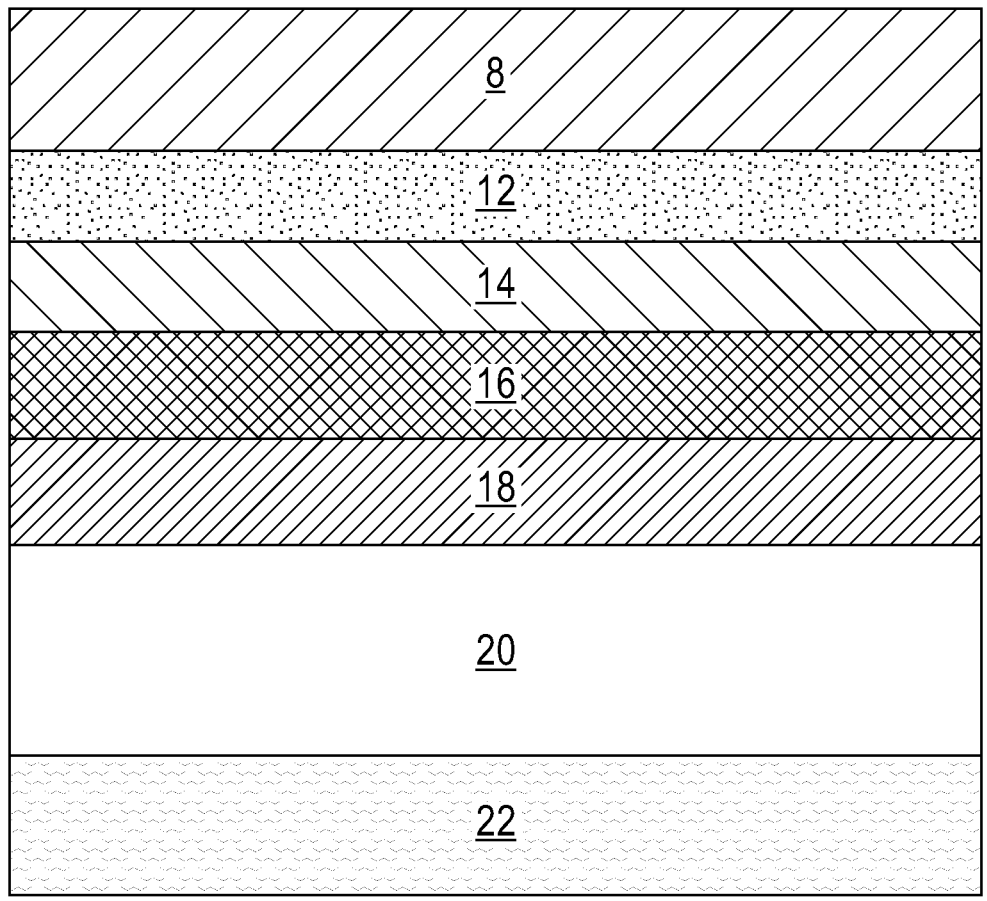
FIG. 2 is a cross sectional view of the exemplary semiconductor structure of FIG. 1 after bonding a topmost silicon germanium sub-layer of the silicon germanium graded buffer layer to a second silicon substrate.

Referring now to FIG. 2, there is illustrated the exemplary semiconductor structure of FIG. 1 after bonding the topmost silicon germanium sub-layer (e.g., sub-layer 20) of the silicon germanium graded buffer layer 10 to a second silicon substrate 22. The second silicon substrate 22 is also a bulk silicon substrate and it is typically single crystalline.

Bonding may be performed utilizing any wafer-to-wafer bonding process well known to those skill in the art. In one embodiment, bonding may be achieved by first bringing the topmost silicon germanium sub-layer (e.g., sub-layer 20) of the silicon germanium graded buffer layer 10 into intimate contact with the second silicon substrate 22, and thereafter a bonding anneal may be performed. In one embodiment, the bonding anneal may be performed at a temperature from 200° C. to 600° C. In some embodiments, the bonding anneal may be omitted. An external force may or may not be applied during the bonding process.

In some embodiments, and prior to wafer bonding, a weakened or "bubble" layer is formed within the topmost sub-layer (e.g., sub-layer 20) of the silicon germanium graded buffer layer 10 by ion implantation. The weakened or "bubble" layer can be used to subsequently transfer a thin portion of the topmost sub-layer (e.g., sub-layer 20) of the silicon germanium graded buffer layer 10 to the second silicon substrate 22. In such an embodiment, the transfer may occur during the bonding anneal process by initiating breakage at the weakened or "bubble" layer within the topmost sub-layer (e.g., sub-layer 20) of the silicon germanium graded buffer layer 10.

Figure 3:
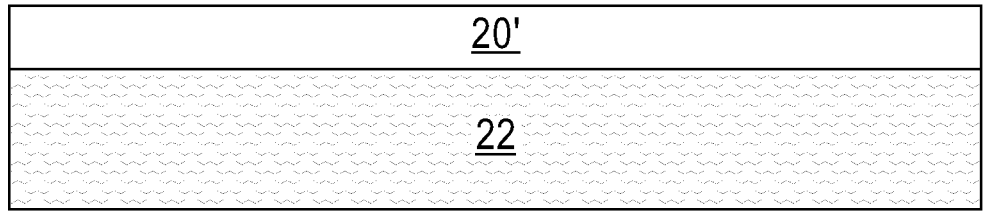
FIG. 3 is a cross sectional view of the exemplary semiconductor structure of FIG. 2 after transferring a portion of the topmost silicon germanium sub-layer to the second silicon substrate.

Referring now to FIG. 3, there is illustrated the exemplary semiconductor structure of FIG. 2 after transferring a portion of the topmost silicon germanium sub-layer (e.g., sub-layer 20) to the second silicon substrate 22. The transferred portion of the topmost silicon germanium sub-layer (e.g., sub-layer 20) may be referred to herein as a topmost silicon germanium sub-layer portion (e.g., sub-layer portion 20'). The thickness of the topmost silicon germanium sub-layer portion (e.g., sub-layer portion 20') may be from 50 nm to 1000 mm. The topmost silicon germanium sub-layer portion (e.g., sub-layer portion 20') has the same germanium content as the topmost silicon germanium sub-layer (e.g., sub-layer 20).

Transferring may be performed during the bonding process itself by forming the weakened or "bubble" layer within the topmost sub-layer (sub-layer 20) of the silicon germanium graded buffer layer 10 and/or after bonding has been performed. When transferring is performed after the bonding, the transferring may be performed by a chemical removal process such as, for example, planarization (i.e., chemical mechanical polishing and/or grinding).

Figure 4:
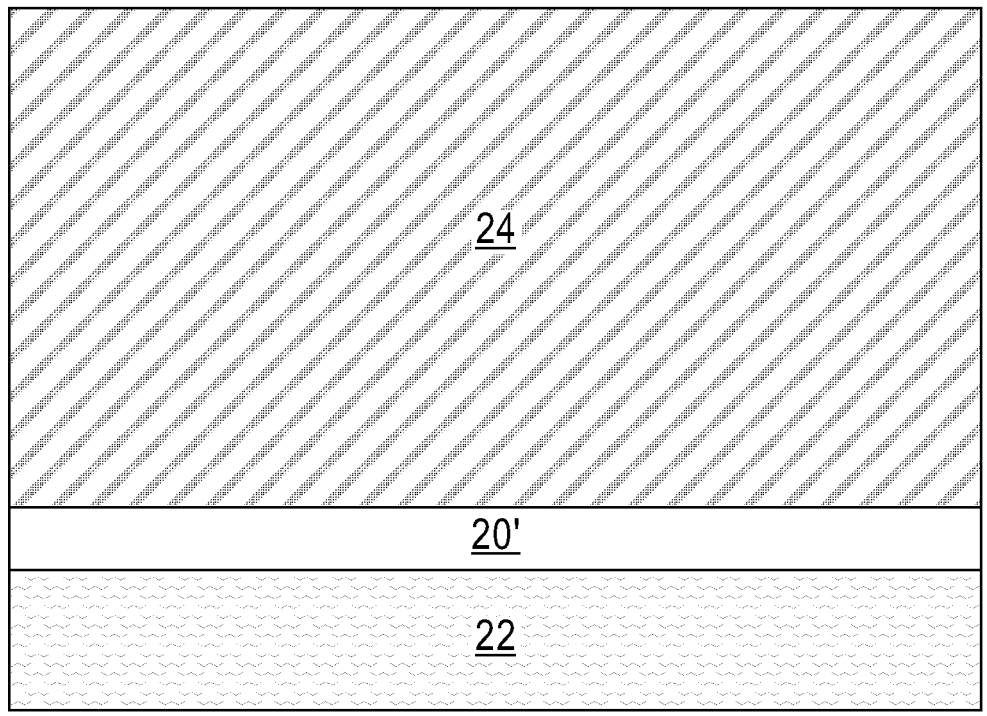
FIG. 4 is a cross sectional view of the exemplary semiconductor structure of FIG. 3 after epitaxially growing a silicon germanium layer having a second thickness that is greater than the first thickness on the transferred portion of the topmost silicon germanium sub-layer.

Referring now to FIG. 4, there is shown the exemplary semiconductor structure of FIG. 3 after epitaxially growing a silicon germanium layer 24 having a second thickness that is greater than the first thickness on the transferred portion of the topmost silicon germanium sub-layer (e.g., topmost silicon germanium sub-layer portion 20'). In one example, the second thickness of the silicon germanium layer 24 is from 5 micrometers to 8 micrometers. The silicon germanium layer 24 is strain relaxed.

The germanium content of the silicon germanium layer 24 is within the range mentioned above for the topmost silicon germanium sub-layer (e.g., sub-layer 20) of the silicon germanium graded buffer layer 10. Epitaxial growth of silicon germanium layer 24 includes the conditions, apparatuses and source gases mentioned above for forming each silicon germanium sub-layer (e.g., sub-layers 12, 14, 16, 18, 20) of the silicon germanium graded buffer layer 10. Silicon germanium layer 24 has a lower defect density and thus less threading dislocation defects as compared with the silicon germanium graded buffer layer 10. In some embodiments in which silicon germanium layer 24 reaches a thickness within the above mentioned range, the threading dislocation defects within the silicon germanium layer 24 are entirely annihilated. In some embodiments, the defect density of the silicon germanium layer 24 is less than 100 defect atoms/cm$^2$.

Figure 5:
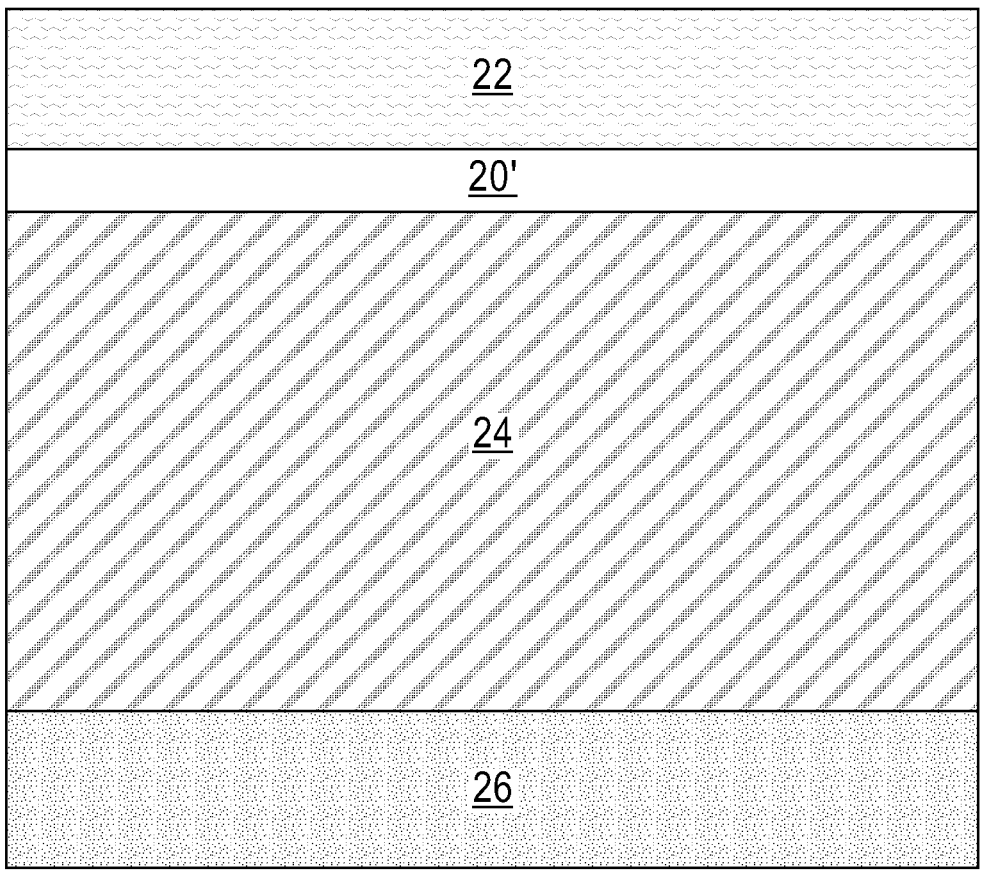
FIG. 5 is a cross sectional view of the exemplary semiconductor structure of FIG. 4 after bonding the silicon germanium layer having the second thickness to a third silicon substrate.

Referring now to FIG. 5, there is illustrated the exemplary semiconductor structure of FIG. 4 after bonding the silicon germanium layer 24 having the second thickness to a third silicon substrate 26. The third silicon substrate 26 is also a bulk silicon substrate and it is typically single crystalline. Bonding may be performed as described above.

Figure 6:
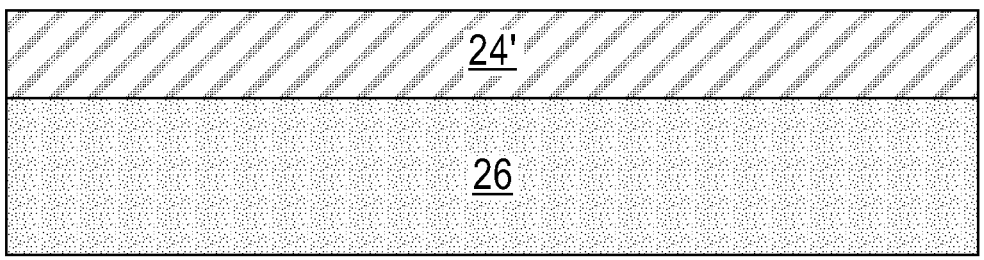
FIG. 6 is a cross sectional view of the exemplary semiconductor structure of FIG. 5 after transferring a portion of the silicon germanium layer having the second thickness to the third silicon substrate.

Referring now to FIG. 6, there is illustrated the exemplary semiconductor structure of FIG. 5 after transferring a portion of the silicon germanium layer 24 having the second thickness to the third silicon substrate 26. The transferred portion of the silicon germanium layer 24 may be referred to herein as silicon germanium layer portion 24'. The thickness of the silicon germanium layer portion 24' that is transferred may be from 50 nm to 1000 mm. The silicon germanium layer portion 24' has the same germanium content as the silicon germanium layer 24.

Transferring may be performed during the bonding process itself by forming the weakened or "bubble" layer within the silicon germanium layer 24 and/or after bonding has been performed. When transferring is performed after the bonding, the transferring may be performed by a chemical removal process such as, for example, planarization (i.e., chemical mechanical polishing and/or grinding).

Figure 7:
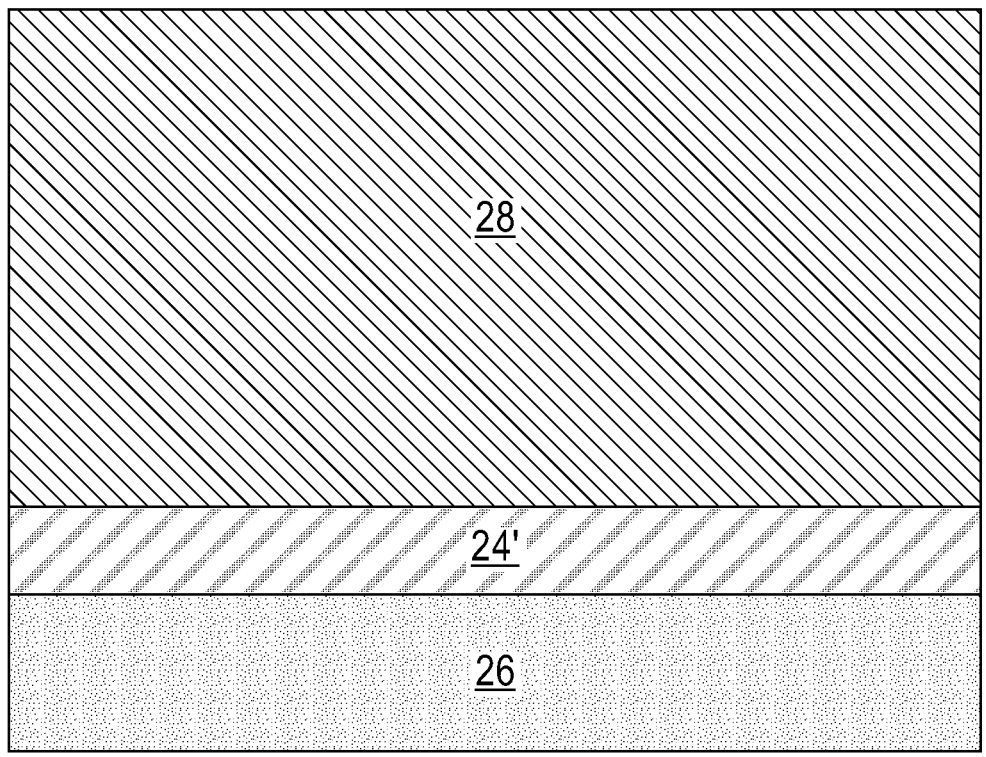
FIG. 7 is a cross sectional view of the exemplary semiconductor structure of FIG. 6 after epitaxially growing a silicon germanium layer having a third thickness on the transferred portion of the silicon germanium layer having the second thickness.

Referring now to FIG. 7, there illustrated the exemplary semiconductor structure of FIG. 6 after epitaxially growing a silicon germanium layer 28 having a third thickness on the transferred portion of the silicon germanium layer 24 (i.e., silicon germanium layer portion 24'). The third thickness of the silicon germanium layer 28 may be the same as, or greater than, the second thickness mentioned above for silicon germanium layer 24. In one example, the third thickness of the silicon germanium layer 28 is from 5 micrometers to 8 micrometers. The silicon germanium layer 28 is strain relaxed.

The germanium content of the silicon germanium layer 28 is within the range mentioned above for the topmost silicon germanium sub-layer (e.g., sub-layer 20) of the silicon germanium graded buffer layer 10. Epitaxial growth of silicon germanium layer 28 includes the conditions, apparatuses and source gases mentioned above for forming each silicon germanium sub-layer (e.g., sub-layers 12, 14, 16, 18, 20) of the silicon germanium graded buffer layer 10. Silicon germanium layer 28 has a lower defect density and thus less threading dislocation defects as compared with the silicon germanium graded buffer layer 10. In some embodiments in which silicon germanium layer 28 reaches a thickness within the above mentioned reach, the threading dislocation defects within the silicon germanium layer 28 are entirely annihilated. In some embodiments, the defect density of the silicon germanium layer 28 is less than 100 defect atoms/cm$^2$.

Figure 8:
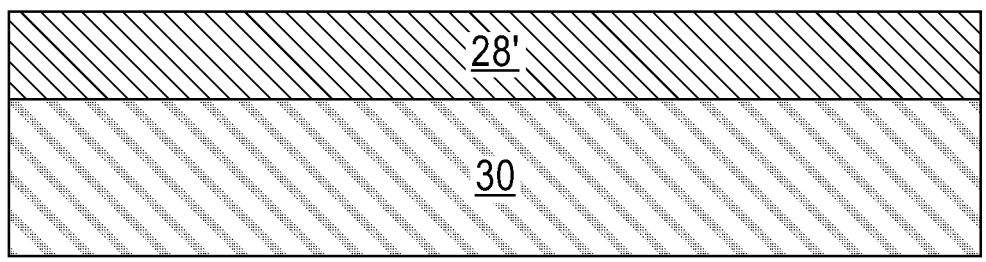
FIG. 8 is a cross sectional view of the exemplary semiconductor structure of FIG. 7 after bonding the silicon germanium layer having the third thickness to a fourth silicon substrate, and transferring a portion of the silicon germanium layer having the third thickness to the fourth silicon substrate.

Referring now to FIG. 8, there is illustrated, the exemplary semiconductor structure of FIG. 7 after bonding the silicon germanium alloy 28 having the third thickness to a fourth silicon substrate 30, and transferring a portion of the silicon germanium layer 28 having the third thickness to the fourth silicon substrate 30. The fourth silicon substrate 30 is also a bulk silicon substrate and it is typically single crystalline. Bonding and layer transferring may be performed as described above. The transferred portion of the silicon germanium layer 28 may be referred to herein as silicon germanium layer portion 28'. The thickness of the silicon germanium layer portion 28' may be from 50 nm to 1000 mm. The silicon germanium layer portion 28' has the same germanium content as the silicon germanium layer 24.

Notably, FIG. 7 shows one exemplary semiconductor structure of the present application which includes a strain relaxed silicon germanium layer (i.e., silicon germanium layer portion 28') having a thickness from 50 nm to 1000 nm and a defect density of less than 100 defect atoms/cm$^2$ located directly on a surface of a silicon substrate (i.e., fourth silicon substrate 30). The lattices of the strain relaxed silicon germanium layer (i.e., silicon germanium layer portion 28') and the silicon substrate (i.e., fourth silicon substrate 30) are misaligned. In the present application, a dislocation network is present at an interface of the strain relaxed silicon germanium layer (i.e., silicon germanium layer portion 28') and the silicon substrate (i.e., fourth silicon substrate 30).

Moreover, no bowing of the exemplary semiconductor structure is observed. Also, it is noted that the various silicon substrates (e.g., substrates 8, 22, 26) that were used and disregarded may be re-used.

Additional steps of silicon germanium growth, bonding and transferring may be used as desired to provide a final semiconductor structure having the properties mentioned above. Also, it is possible to use on one cycle of silicon germanium growth, bonding and transferring. Thus, it is possible to stop the process after forming the structure shown in FIG. 6.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a strain relaxed silicon germanium layer having a thickness from 50 nm to 1000 nm and a defect density of less than 100 defect atoms/cm$^2$ located directly on a surface of a silicon substrate, wherein lattices of the strain relaxed silicon germanium layer and the silicon substrate are misaligned.

2. The semiconductor structure of claim 1, wherein the strain relaxed silicon germanium layer has a germanium content from 20 atomic percent germanium to 25 atomic percent germanium.

3. The semiconductor structure of claim 1, wherein a dislocation network is present at an interface of the strain relaxed silicon germanium layer and the silicon substrate.

4. The semiconductor structure of claim 1, wherein the strain relaxed silicon germanium layer is devoid of threading dislocation defects.

5. The semiconductor structure of claim 1, wherein the silicon substrate is a bulk substrate.

6. The semiconductor structure of claim 1, wherein the silicon substrate is single crystalline.

7. The semiconductor structure of claim 1, wherein the silicon substrate is devoid of wafer bowing.

8. The semiconductor structure of claim 1, wherein a bonding interface is located between the silicon substrate and the strain relaxed silicon germanium layer.

9. A semiconductor structure comprising:
a strain relaxed silicon germanium layer having a thickness from 50 nm to 1000 nm and devoid of threading dislocation defects located directly on a surface of a silicon substrate, wherein lattices of the strain relaxed silicon germanium layer and the silicon substrate are misaligned and the silicon substrate is devoid of wafer bowing.

10. The semiconductor structure of claim 9, wherein the strain relaxed silicon germanium layer has a germanium content from 20 atomic percent germanium to 25 atomic percent germanium.

11. The semiconductor structure of claim 9, wherein a dislocation network is present at an interface of the strain relaxed silicon germanium layer and the silicon substrate.

12. The semiconductor structure of claim 9, wherein the silicon substrate is a bulk substrate.

13. The semiconductor structure of claim 9, wherein the silicon substrate is single crystalline.

14. A semiconductor structure comprising:
a strain relaxed silicon germanium layer having a germanium content from 20 atomic percent germanium to 25 atomic percent germanium, a thickness from 50 nm to 1000 nm and a defect density of less than 100 defect atoms/cm$^2$ located directly on a surface of a single crystalline silicon substrate, wherein lattices of the strain relaxed silicon germanium layer and the single crystalline silicon substrate are misaligned, wherein a dislocation network is present at an interface of the strain relaxed silicon germanium layer and the silicon substrate, and wherein the silicon substrate is devoid of wafer bowing.

15. The semiconductor structure of claim 14, wherein the strain relaxed silicon germanium layer is devoid of threading dislocation defects.

\* \* \* \* \*